United States Patent
Cognault et al.

(10) Patent No.: US 9,372,258 B2
(45) Date of Patent: Jun. 21, 2016

(54) METHOD FOR ELECTROMAGNETICALLY CHARACTERIZING A TARGET

(75) Inventors: Aurore Cognault, Saint-Medard-En-Jalles (FR); Sylvain Morvan, Saint-Medard-En-Jalles (FR); Olivier Vacus, Cestas (FR)

(73) Assignee: Commissariat a L'Energie Atomique et aux Energies Alternatives, Paris (FR)

( * ) Notice: Subject to any disclaimer, the term of this patent is extended or adjusted under 35 U.S.C. 154(b) by 1048 days.

(21) Appl. No.: 13/265,321

(22) PCT Filed: Apr. 22, 2010

(86) PCT No.: PCT/EP2010/055342
§ 371 (c)(1),
(2), (4) Date: Oct. 19, 2011

(87) PCT Pub. No.: WO2010/122101
PCT Pub. Date: Oct. 28, 2010

(65) Prior Publication Data
US 2012/0041719 A1 Feb. 16, 2012

(30) Foreign Application Priority Data
Apr. 24, 2009 (FR) .................................... 09 52712

(51) Int. Cl.
*H03F 1/26* (2006.01)
*H01Q 17/00* (2006.01)
(Continued)

(52) U.S. Cl.
CPC ............... *G01S 7/41* (2013.01); *G01R 29/0892* (2013.01); *G06F 17/16* (2013.01); *H01Q 15/14* (2013.01)

(58) Field of Classification Search
CPC ............ G01S 7/41; G06F 17/16; H01Q 15/14; H01Q 17/00
USPC ............ 702/189, 198, 191, 195; 342/1, 179, 5
See application file for complete search history.

(56) References Cited

U.S. PATENT DOCUMENTS

| 5,936,568 A * | 8/1999 | Berg et al. .................. 342/1 |
| 6,756,935 B1 | 6/2004 | Cameron et al. |
| 2010/0109941 A1 * | 5/2010 | Vacus et al. .................. 342/179 |

FOREIGN PATENT DOCUMENTS

FR      2914750 A1    10/2008

OTHER PUBLICATIONS

Hess, D. W., "Introduction to RCS Measurements," 2008 Loughborough Antennas & Propagation Conference, Mar. 17-18, 2008, Loughborough, UK, pp. 37-44.
(Continued)

*Primary Examiner* — Gregory J Toatley
*Assistant Examiner* — Eman Alkafawi
(74) *Attorney, Agent, or Firm* — Nixon Peabody LLP; Khaled Shami

(57) ABSTRACT

A method for electromechanically characterizing an object placed in a chamber, at least some walls of which have low absorbance at said frequency, one of the chamber walls being provided with an antenna array. In a first step, the parameters S of a first system consisting of the chamber and the antenna array are measured and in a second step, the same parameters S of a second system consisting of the chamber, the object and the antenna array are measured. The parameters S of the first system are subtracted from the parameters S of the second system to obtain a matrix of corrected parameters that is then diagonalized. The eigenvalues of the matrix constitute a characteristic electromagnetic signature of said object.

7 Claims, 3 Drawing Sheets

(51) Int. Cl.
  *G01S 7/41* (2006.01)
  *G06F 17/16* (2006.01)
  *H01Q 15/14* (2006.01)
  *G01R 29/08* (2006.01)

(56) References Cited

OTHER PUBLICATIONS

Larsson, C. et al., "Measuring the Extinction Cross Section," Larsson C et al: "Measuring the Extinction Cross Section," Antennas & Propagation Conference, 2009, EUCAP 2009. 3rd European Conference on IEEE, Piscataway, NJ, USA, Mar. 23, 2009, pp. 3633-3636.

International Search Report and Written Opinion in PCT Application No. PCT/EP2010/055342, mailed Jul. 23, 2010.

International Preliminary Report on Patentability in PCT Application No. PCT/EP2010/055342, dated Aug. 12, 2011.

Harrington, R. F. et al., "Theory of Characteristic Modes for Conducting Bodies," IEEE Transactions on Antennas and Propagation, vol. A-p. 19, No. 5, Sep. 1971, pp. 622-628.

* cited by examiner

METHOD FOR ELECTROMAGNETICALLY CHARACTERIZING A TARGET

CROSS REFERENCE TO RELATED APPLICATIONS OR PRIORITY CLAIM

This application is a National Phase of PCT/EP2010/055342, filed Apr. 22, 2010, entitled, "METHOD FOR ELECTROMAGNETICALLY CHARACTERIZING A TARGET", and which claims priority of French Patent Application No. 09 52712, filed Apr. 24, 2009, the contents of which are incorporated herein by reference in their entirety.

TECHNICAL FIELD

The present invention relates to the field of the electromagnetic characterization of a target in the low frequency field. It is in particular applicable in the field of monitoring or maintenance.

BACKGROUND OF THE INVENTION

A target is traditionally characterized by its radar cross-section (RCS). The RCS of a radar target is defined from the power balance of the wave emitted toward the target and the power of the wave received by the radar. In far field and by approximating the waves to plane waves, the radar equation is written:

$$P_r = P_e G_e \frac{1}{4\pi d^2} \sigma \frac{1}{4\pi d^2} G_r \frac{\lambda^2}{4\pi} \quad (1)$$

where $P_e$ and $P_r$ are the wave powers transmitted and received by the radar, respectively, $G_e$ and $G_r$ are the antenna gains upon transmission and reception, d is the distance between the radar and the target, $\lambda$ is the wavelength used by the radar. The coefficient $\sigma$ is homogenous to a surface and only depends on the considered target, which is the RCS of the target.

In expression (1), it is assumed that the radar used to illuminate the target was the same as that serving to receive the diffracted wave, which is then referred to as a monostatic RCS. As a general rule, the monostatic RCS depends on the direction of the incident wave, the frequency f of the radar and the respective polarizations $\pi_e$ and $\pi_r$ with which the incident wave is transmitted and the received wave is analyzed. It is denoted SER(f,ω,θ,$\pi_e$,$\pi_r$), where (ω,θ) are the azimuth and roll angles of the radar in a referential related to the target. Each of the polarizations $\pi_e$ and $\pi_r$ can be horizontal or vertical, i.e. $\pi_e$=H or V; $\pi_r$=H or V.

The measurement of an RCS is done in an anechoic location, i.e. a location whereof the walls are covered with sound-absorbing materials, so as to prevent parasitic echoes. The target is positioned using a lowly-echogenic positioner, generally on a vertical column made from polystyrene that can be oriented around its eigenaxis. The measurement is done either using a single antenna, or using two separate antennas that are slightly angularly offset relative to each other. Depending on the case, one obtains the monostatic RCS or quasi-monostatic RCS values, for one or more azimuth angles. The transmission antenna must be chosen so as to generate as flat a wave as possible.

Characterizing an object by its RCS has a certain number of drawbacks.

First, it is very expensive to build an anechoic location for large objects. This problem is worse at low frequency, i.e. for wavelengths in the vicinity of the size of the object, i.e. traditionally in the vicinity of one meter to several tens of meters, where the effectiveness of the sound-absorbing materials is lower. The measurements done are generally affected by noises from various sources (parasitic echoes, instrumentation noise, etc.).

Also in a low-frequency system, the illumination antenna must be large so as to be able to generate approximately planar waves.

Lastly, generally only several RCS value measurements are done, typically according to several azimuth angles in an equatorial plane so that one only has a fairly summary directional characterization of the target.

The RCS measurement therefore assumes using significant material resources and does not, particularly in low frequency, make it possible to characterize the electromagnetic diffraction by an object satisfactorily.

Furthermore, in the monitoring or maintenance field, it is often sufficient to verify the compliance of the characteristics of an object with a predetermined template or to evaluate the evolution of these characteristics over time. The recourse to characterization by RCS can then prove needlessly complex relative to the goal sought.

The object of the present invention is to propose a method for electromagnetically characterizing an object that is easy to carry out, including in the low frequency field, and which makes it possible, however, to verify that the object has electromagnetic diffraction characteristics according to a template or reference values, in relevant directions.

BRIEF DESCRIPTION OF THE INVENTION

In a first embodiment, the present invention is defined as a method for electromechanically characterizing an object at a given frequency, according to which said object is placed in a chamber, at least some walls of which have low absorbance at said frequency, one of the chamber walls being provided with an antenna array, each antenna being able to transmit one and receive several electromagnetic waves according to a first polarization and a second polarization orthogonal to the first, said method comprising the following steps:

when said object is not present in the chamber, the parameters S of a first system consisting of the chamber and the antenna array are measured, the parameters S of the first system being measured for each transmitting antenna, each transmission polarization and each receiving antenna, each reception polarization;

when said object is present in the chamber, the parameters S of a second system consisting of the chamber, the object and the antenna array are measured, the parameters S of the second system being measured for each transmitting antenna, each transmission polarization and each receiving antenna, each reception polarization;

the parameters S of the first system are subtracted from the corresponding parameters S of the second system to obtain a matrix of corrected parameters S with dimension 2N×2N;

the eigenvalues of the matrix thus obtained are calculated and at least one sublist of the list of said eigenvalues is provided as electromagnetic characteristic of said object.

Advantageously, the eigenvalues of said matrix are obtained using:

$$\lambda_p = V_p^H \Delta S V_p, \ p=1, \ldots, 2N$$

where ΔS is said matrix, $V_p$ are its eigenvectors and N is the number of antennas in the array.

According to a second embodiment, the invention is defined by a method for electromagnetically characterizing an object at a given frequency, according to which said object is placed in a chamber whereof at least some of the walls have a low absorbance at said frequency, one of the chamber walls being equipped with an antenna array, each antenna being able to transmit one and receive several electromagnetic waves according to a first polarization and a second polarization orthogonal to the first, said method comprising the following steps:

- when said object is not present in the chamber, a first set of complex values is measured, each complex value being determined as the ratio between the amplitude of a received wave and a transmitted wave, the transmitted wave being obtained by weighting signals transmitted by the different antennas using the first complex weighting coefficients, and the received wave being obtained by weighting signals received by the same antennas using second complex weighting coefficients;
- when said object is present in the chamber, a second set of complex values is measured, each complex value being determined as the ratio between the amplitude of a received wave and a transmitted wave, the transmitted wave being obtained by weighting the signals transmitted by the different antennas using said first complex weighting coefficients, and the received wave being obtained by weighting signals received by the same antennas using said second complex weighting coefficients;
- the complex values of the first set are subtracted from the corresponding complex values of the second set to obtain a list of corrected complex values and at least one sublist of the list of corrected complex values is provided as electromagnetic characteristic of said object.

Advantageously, for each complex value of the first or second set, the first weighting coefficients are the elements of an eigenvector of a matrix of corrected parameters S and the second weighting coefficients are obtained by complex conjugation of the first weighting coefficients, the matrix of corrected parameters S being obtained by the difference between the matrix of parameters S of a first system and that of a second system, the first system consisting of the chamber and said antenna array, the second system consisting of the chamber, the object and said antenna array, the parameters S of the first and second systems being measured for each transmitting antenna as well as each transmission polarization and each receiving antenna as well as each receiving polarization.

In both the first and second embodiments, the eigenvectors can be determined beforehand from a matrix of the corrected parameters S, said matrix being obtained using a simulation. Alternatively, said eigenvectors can be determined beforehand from a matrix of corrected parameters S, said matrix being obtained by using a model of said object.

The chamber is typically parallelepiped and open at one end, the antenna array being arranged on the face of the rhomb opposite the open end. The walls of the chamber can be metallic.

The antenna array is advantageously two-dimensional.

Lastly, the steps of the aforementioned electromagnetic characterization method can be repeated for a plurality of frequencies belonging to a predetermined frequency band.

BRIEF DESCRIPTION OF THE DRAWINGS

Other features and advantages of the invention will appear upon reading one preferred embodiment of the invention described using the attached figures.

DETAILED DESCRIPTION OF THE INVENTION

Hereafter we will consider an object O whereof one wishes to characterize the electromagnetic diffraction properties, advantageously but not exclusively in low frequency, within the meaning defined above. This object can generally be modeled using an impedance condition, i.e. by a layer of material with electrical permittivity $\epsilon_r$ and magnetic permeability $\mu_r$ covering a perfect conductor. The object in question can be inhomogenous, in which case the thickness of the layer, its electrical permittivity, its magnetic permeability can differ from one point to another of the object. It will be recalled that the impedance of a layer with thickness e, electrical permittivity $\epsilon_r$ and magnetic permeability $\mu_r$ is given by:

$$\eta = -i\sqrt{\frac{\mu_r}{\epsilon_r}} \tan(ke\sqrt{\epsilon_r\mu_r}) \tag{2}$$

where $$k = \frac{2\pi}{c}f$$

is the wave number of the incident wave, f is its frequency and c is the speed of the light in the vacuum. The choice of the temporal dependency of the waves is traditionally taken in $\exp(-i\omega t)$.

The object O for which one seeks to characterize the electromagnetic diffraction properties can be of any shape.

Figure 1:
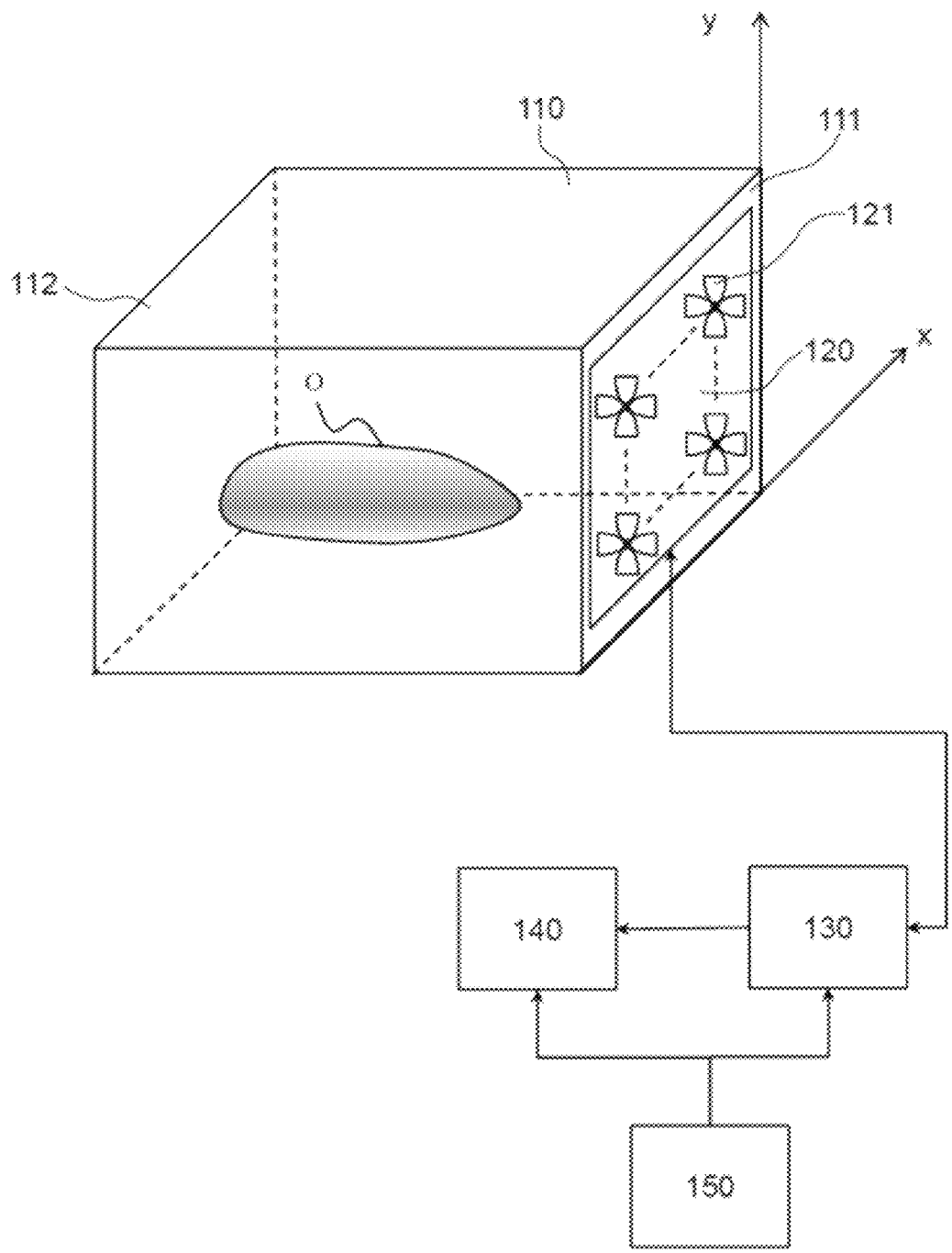
FIG. 1 diagrammatically shows an example of an experimental device making it possible to implement the method for electromagnetically characterizing a target according to one embodiment of the invention.

FIG. 1 diagrammatically illustrates one example of an experimental device for implementing the characterization method according to one embodiment of the invention.

The experimental device comprises a chamber 110, advantageously parallelepiped and open at one end, in which the object O to be characterized is placed. The object O can be placed on a positioner or suspended within a chamber 110, preferably at the center of the chamber.

All or some of the walls of the chamber have a low absorbance at the measurement frequency. Low absorbance here means that these walls make it possible to absorb only few or none of the electromagnetic waves at the measuring frequency and therefore a majority of these waves are reflected. In particular, these walls can be metallic and therefore highly reflective.

One of these walls 111, advantageously the face of the parallelepiped opposite the open end 112, is equipped with an antenna array, typically a two-dimensional array 120, connected to a transmission/reception device 130, that device itself being controlled by control means 150. The transmission/reception device is connected to an array analyzer 140, also steered by the control means 150.

The antennas 121 of the two-dimensional array 120 have a polarization diversity and can transmit and receive in two orthogonal directions of polarization, preferably in directions x and y defining the plane of the two-dimensional array, i.e. respectively according to a horizontal polarization and a vertical polarization. The antennas 121 can for example be of the folded dipole type.

The transmission/reception device 130 is controlled by the control means 140 so that one or more antenna(s) 121 can transmit at the same time, in horizontal polarization or vertical polarization. When several antennas transmit simultaneously, the control device makes it possible to control the complex gains (gains and phase shifts) of the transmitting antennas. Likewise, the transmission/reception device 130 is controlled so that a single antenna receives or certain antennas 121 receive at the same time, according to a horizontal or vertical polarization. When several antennas receive simultaneously, the control device makes it possible to control the complex gains (gains and phase shifts) applied to the different signals received by these antennas.

If N denotes the number of antennas, the system consisting of the chamber, the object O and the N antennas can be considered a multipolar with 2N inputs and 2N outputs, where the factor 2 translates the polarization diversity. S denotes the matrix of size 2N×2N of the parameters S of that multipolar, i.e.:

$$S = \begin{pmatrix} S_{11}^{HH} & S_{12}^{HH} & \cdots & S_{1N}^{HH} & S_{11}^{HV} & S_{12}^{HV} & \cdots & S_{1N}^{HV} \\ S_{21}^{HH} & S_{22}^{HH} & \cdots & S_{2N}^{HH} & S_{21}^{HV} & S_{22}^{HV} & \cdots & S_{2N}^{HV} \\ \vdots & \vdots & \ddots & \vdots & \vdots & \vdots & \ddots & \vdots \\ S_{N1}^{HH} & S_{N2}^{HH} & \cdots & S_{NN}^{HH} & S_{N1}^{HV} & S_{N2}^{HV} & \cdots & S_{NN}^{HV} \\ S_{11}^{VH} & S_{12}^{VH} & \cdots & S_{1N}^{VH} & S_{11}^{VV} & S_{12}^{VV} & \cdots & S_{1N}^{VV} \\ S_{21}^{VH} & S_{22}^{VH} & \cdots & S_{2N}^{VH} & S_{21}^{VV} & S_{22}^{VV} & \cdots & S_{2N}^{VV} \\ \vdots & \vdots & \ddots & \vdots & \vdots & \vdots & \ddots & \vdots \\ S_{N1}^{VH} & S_{N2}^{VH} & \cdots & S_{NN}^{VH} & S_{N1}^{VV} & S_{N2}^{VV} & \cdots & S_{NN}^{VV} \end{pmatrix} \quad (3)$$

where each element $S_{ij}^{\pi_e \pi_r}$ is the complex value of the parameter S for a wave transmitted by the antenna i with a polarization $\pi_e$=H or V and received by antenna j according to a polarization $\pi_r$=H or V with i,j=1, ..., N. More specifically, the parameter $S_{ij}^{\pi_e \pi_r}$ is the ratio of the complex amplitude of the wave received by the antenna j according to a polarization $\pi_r$ and the complex amplitude of the wave transmitted by the antenna i with a polarization $\pi_e$.

The array analyzer 140 makes it possible to calculate the parameters S of the multipole, i.e. the coefficients of the matrix S from the signals transmitted and received by the antenna array.

Figure 2:
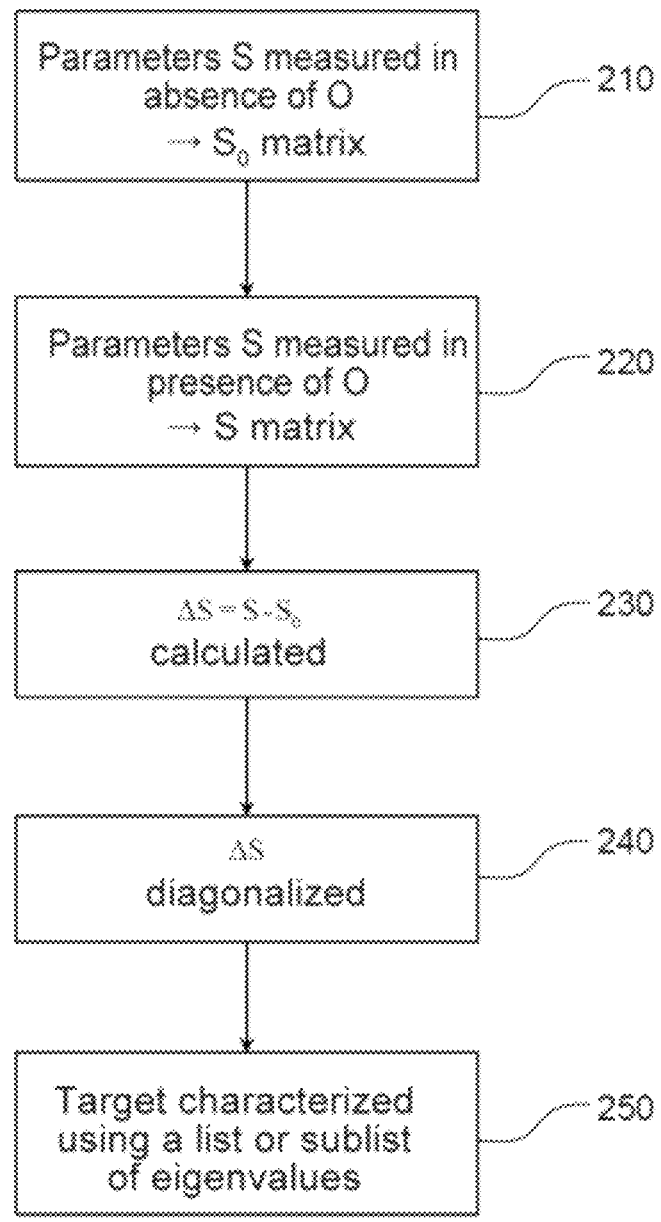
FIG. 2 diagrammatically illustrates a flowchart of the method for characterizing a target according to a first embodiment of the invention.

FIG. 2 diagrammatically illustrates the flowchart of the characterization method according to a first embodiment of the invention.

In step 210, the parameters S are measured without the object to be characterized being present. The elementary antennas are excited in turn according to their horizontal polarization and their vertical polarization, and the signals received by the different antennas are sent sequentially or in parallel to the array analyzer.

One thus obtains a matrix $S_0$ providing the parameters S of a first system consisting of the chamber and the antenna array (and, if applicable, the positioner when it is present). It will be noted that due to the propagation symmetry, it may suffice to determine half of the non-diagonal terms of the matrix, since $S_{ij}^{\pi_e \pi_r} = S_{ji}^{\pi_e \pi_r}$ with the above notations.

In step 220, the parameters S are measured in the presence of the object placed in the chamber. To that end, the elementary antennas are excited sequentially according to their horizontal polarization and their vertical polarization and the signals received by the different antennas are sent sequentially or in parallel to the array analyzer, as before.

A matrix S is thus obtained giving the parameters S of a second system consisting of the chamber, the object O to be characterized and the antenna array. For the same reason as before, only half of the non-diagonal terms of the matrix may be determined.

It will be noted that steps 210 and 220 could be inverted, the order of the measurement being indifferent.

In step 230, the matrix $S_0$ is subtracted from the matrix$^S$. The difference $\Delta S = S - S_0$ makes it possible to substantially do away with the diffraction response of the chamber (and the positioner when it is present).

It is possible to show that, if the surface of the object is perfectly conductive, the matrix $\Delta S$, then denoted $\Delta S^\infty$, can be diagonalized, at least on first approximation. This property should be compared to the fact that the diffraction operator can itself be diagonalized in a base of characteristic far fields. Diffraction operator refers to the function defined on the space the square integratable functions $L^2(R^3)$ which associates the far field of the corresponding exiting wave with the far field of an entering wave. Each characteristic far field is due to the radiation of a current distribution on the surface of the object, called characteristic current. A theory of characteristic currents can be found in the article by R. F. Harrington and J. R. Mautz entitled "Theory of characteristic modes for conducting bodies" published in IEEE Trans. on Antennas and Propagation, Vol. AP-19, No. 5, 1971. In the present case, this property is only verified on first approximation since the incident waves on the object and the waves diffracted toward the antenna array are in fact spherical waves, and the propagation does not occur in a free space, but in a space confined by the chamber.

It has also been possible to show, experimentally, that for any real object modeled by an impedance conditions such as (2), i.e. by the aforementioned perfectly conductive object, covered with a layer having a homogenous thickness e and an impedance η, the matrix $\Delta S$ obtained by the measurement switched with the matrix $\Delta S^\infty$. Furthermore, it has been experimentally observed that this switching property remains valid for an object having distinct impedances.

Thus, on first approximation, the matrices $\Delta S$ relative to objects differing only by their impedance conditions can be diagonalized in a same base of eigenvectors and that base only depends a priori on the shape of the object O to be characterized.

In step 240, the matrix $\Delta S$ obtained in step 230 is diagonalized.

The matrix $\Delta S$ can then be written as:

$$\Delta S = WDW^{-1} \quad (4)$$

where $D=\mathrm{diag}(\lambda_1, \ldots, \lambda_{2N})$ is the diagonal matrix having for elements the eigenvalues $\lambda_1, \ldots, \lambda_{2N}$ of $\Delta S$ and where W is the basic change matrix.

A number of diagonalization techniques can be considered, in particular those making it possible to directly obtain the eigenvalues, for example the Gaussian elimination method.

Alternatively, if the eigenvectors $V_p$, p=1, ..., 2N of the matrix $\Delta S$ are known, the corresponding eigenvalues can be deduced by projection:

$$\lambda_p = V_p^H \Delta S V_p \quad (5)$$

where $V_p^H$ is the conjugated transpose of the vector $V_p$. In fact, expression (5) provides the eigenvalues $\lambda_p$ when the eigenvectors are unitary, i.e. if $V_p^H V_p = 1$. It will, however, be understood that expression $V_p^H \Delta S V_p$ provides the eigenvalue $\lambda_p$ to within the norm of the vector $V_p$: the values $V_p^H \Delta S V_p$, $p=1, \ldots, 2N$ represent, in all cases, an electromagnetic signature of the object inasmuch as the same eigenvectors are used to compare the characteristics of an object with those of a reference object or to compare the characteristics of an object at two different moments.

The eigenvectors can be determined using multiple methods, known as such. For example, the latter can be obtained once for all using a diffraction simulation on the supposedly perfectly conductive object or from the measured matrix $\Delta S$ for a model of the object, or from the measured matrix $\Delta S$ for an object having a reference RCS.

The ordered list of the eigenvalues $\lambda_p$, $p=1, \ldots, 2N$ provided in 250 unambiguously characterizes the impedance distribution on the object and consequently constitutes an electromagnetic signature of that object at the measuring frequency, in the same way as the RCS. It is also possible to extract a sublist from that list to characterize the object. For example, it will suffice to extract the most significant eigenvalues from the list, i.e. those having the highest modules. This sublist can be reduced to the most significant eigenvalue of the list.

According to one alternative, this electromagnetic signature is measured at a plurality of frequencies, for example at regular intervals in a frequency band of interest.

The electromagnetic signature can be compared to a reference signature to verify whether the object indeed has the required diffraction characteristics. It can also be measured during the lifetime of the object to examine whether its diffraction characteristics evolve over time (for example separation or deterioration of a dielectric coating).

Figure 3:
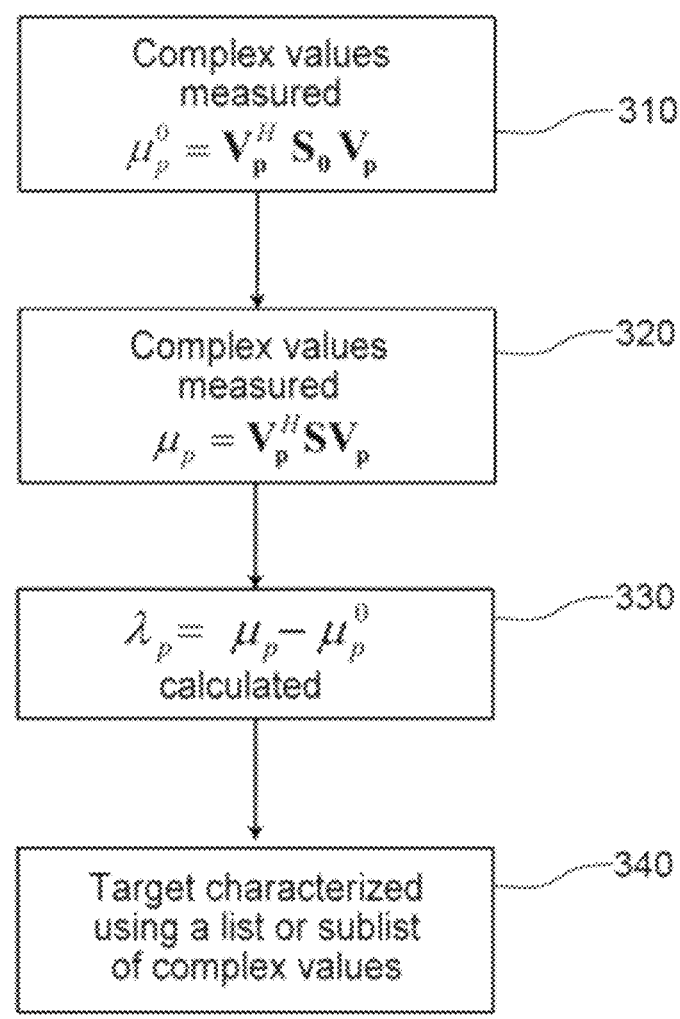
FIG. 3 diagrammatically illustrates a flowchart of the method for characterizing a target according to a second embodiment of the invention.

FIG. 3 diagrammatically shows the flowchart of the characterization method according to a second embodiment of the invention.

This second embodiment assumes that one has previously obtained the eigenvectors $V_p$, $p=1, \ldots, 2N$, relative to the object to be characterized.

In a first step 310, the complex values are determined:

$$\mu_p^0 = V_p^H S_0 V_p \quad (6)$$

To that end, when the object to be characterized is not present in the chamber, for each $p=1, \ldots, 2N$, a weighting is done upon transmission of the 2N signals to be transmitted by the complex elements of the vector $V_p$ and a weight of the 2N signals received by the complex elements of the vector $V_p^H$ is applied on reception. This weighting amounts to performing a path formation operation both upon transmission and reception, using a plurality of sets of complex coefficients, each set corresponding to an eigenvector $V_p$.

It will be understood that this weighting upon transmission and reception makes it possible to directly perform a projection of the measurement on each of the eigenvectors.

One thus obtains the values $\mu_p^0$, $p=1, \ldots, 2N$.

In a second step 320, the complex values are measured:

$$\mu_p = V_p^H S V_p \quad (7)$$

in the same way as in the first step, but this time having previously placed the object to be characterized in the chamber.

The complex weighting values upon transmission and reception are the same as before and may therefore have been stored in memory by the control means.

One thus obtains the values $\mu_p$, $p=1, \ldots, 2N$.

In a third step 330, the values $\lambda_p$, $p=1, \ldots, 2N$ are determined using:

$$\lambda_p = \mu_p - \mu_p^0 \quad (8)$$

and as a result the aforementioned electromagnetic signature. As before, the electromagnetic signature provided in 340 can consist of a sublist of the list of these complex values.

It will be understood that the advantage of the second embodiment relative to the first embodiment is to reduce the number of measurements performed in steps 210 and (2N instead of $4N^2$ per step if one does not take into account the symmetry relationships of the matrix S) by directly performing a modal projection.

In all cases, the electromagnetic signature consisting of the eigenvalues can serve to characterize the electromagnetic diffraction properties by the object, and for one or more frequencies.

The invention claimed is:

1. A method for electromagnetically characterizing an object at a given frequency, characterized in that said object is placed in a chamber whereof at least some of the walls have a low absorbance at said frequency, one of the chamber walls being equipped with an array of antennas, each antenna being able to transmit one and receive several electromagnetic waves according to a first polarization and a second polarization orthogonal to the first, said method comprising the following steps:

when said object is not present in the chamber, measuring a first set of complex values ($\mu_p^0$, $p=1,\ldots,2N$), each complex value being determined as the ratio between the amplitude of a received wave and a transmitted wave, the transmitted wave being generated by weighting signals transmitted by the antennas using first complex weighting coefficients, and the received wave being generated by weighting signals received by the same antennas using second complex weighting coefficients;

when said object is present in the chamber, measuring a second set of complex values ($\mu_p$, $p=1,\ldots,2N$), each complex value being determined as the ratio between the amplitude of a received wave and a transmitted wave, the transmitted wave being generated by weighting the signals transmitted by the antennas of the array using said first complex weighting coefficients, and the received wave being generated by weighting signals received by the same antennas using said second complex weighting coefficients, wherein, for each complex value of the first or second set, the first weighting coefficients are the elements of an eigenvector of a matrix of corrected parameters S and the second weighting coefficients are obtained by complex conjugation of the first weighting coefficients, the matrix of corrected parameters S defined as the difference between the matrix of parameters S of a first system and that of a second system, the first system consisting of the chamber and said array of antennas, the second system consisting of the chamber, the object and said array of antennas, the parameters S of the first and second systems being defined for each transmitting antenna as well as each transmission polarization and each receiving antenna as well as each receiving polarization;

outputting an electromagnetic characteristic of said object by subtracting the complex values of the first set from the corresponding complex values of the second set to obtain a list of corrected complex values, said electromagnetic characteristic being obtained as at least one sublist of said list of corrected complex values.

2. The electromagnetic characterization method according to claim 1, characterized in that said eigenvectors are determined beforehand from a matrix of the corrected parameters S, said matrix being obtained using a simulation.

3. The electromagnetic characterization method according to claim 1, characterized in that said eigenvectors can be determined beforehand from a matrix of corrected parameters S, said matrix being obtained by using a model of said object.

4. The electromagnetic characterization method according to claim 1, characterized in that the chamber is parallelepiped and open at one end, the array of antennas being arranged on the face of the parallelepiped opposite the open end.

5. The electromagnetic characterization method according to claim 1, characterized in that the walls of the chamber are metallic.

6. The electromagnetic characterization method according to claim 1, characterized in that the array of antennas is two-dimensional.

7. The electromagnetic characterization method according to claim 1, characterized in that it is repeated for a plurality of frequencies belonging to a predetermined frequency band.

* * * * *